United States Patent
Hemmi et al.

(10) Patent No.: US 9,595,773 B2
(45) Date of Patent: Mar. 14, 2017

(54) PROBE PIN HAVING A FIRST PLUNGER WITH A GUIDE PROJECTION SLIDINGLY MOVABLE IN A GUIDE SLOT OF A SECOND PLUNGER

(71) Applicant: OMRON Corporation, Kyoto-shi, Kyoto (JP)

(72) Inventors: Yoshinobu Hemmi, Shiga (JP); Takahiro Sakai, Shiga (JP); Hirotada Teranishi, Osaka (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 14/787,518

(22) PCT Filed: Jul. 18, 2014

(86) PCT No.: PCT/JP2014/069237
§ 371 (c)(1),
(2) Date: Oct. 28, 2015

(87) PCT Pub. No.: WO2015/025662
PCT Pub. Date: Feb. 26, 2015

(65) Prior Publication Data
US 2016/0072202 A1    Mar. 10, 2016

(30) Foreign Application Priority Data

Aug. 21, 2013   (JP) ................. 2013-171082

(51) Int. Cl.
*H01R 13/24*   (2006.01)
*H01R 4/48*    (2006.01)
(Continued)

(52) U.S. Cl.
CPC ........... *H01R 4/48* (2013.01); *G01R 1/06722* (2013.01); *H01R 13/2421* (2013.01);
(Continued)

(58) Field of Classification Search
CPC ............ H01R 13/2421; H01R 13/2428; H01R 23/722; H01R 33/46; H01R 2202/20; H01R 11/18; H01R 13/24
(Continued)

(56) References Cited

U.S. PATENT DOCUMENTS 6,685,492 B2 *   2/2004   Winter ................. G01R 1/0466
                                              324/754.08
7,008,270 B1 *   3/2006   Huh ..................... G02B 6/3821
                                              439/700
(Continued)

FOREIGN PATENT DOCUMENTS

JP   2008-516398 A   5/2008
JP   2008-546164 A   12/2008
(Continued)

OTHER PUBLICATIONS

International Search Report issued in corresponding application No. PCT/JP2014/069237 mailed Oct. 21, 2014 (4 pages).
(Continued)

*Primary Examiner* — Chandrika Prasad
(74) *Attorney, Agent, or Firm* — Osha Liang LLP (57) ABSTRACT

A probe pin has a coil spring having a first end and a second end, a first plunger having a major portion, and a first elastic extension and a second elastic extension that from the major portion in the same direction, and a second plunger forcedly inserted between the first and the second elastic extensions. The first and the second plungers have electric conductivity. The first and the second plungers are inserted from the first and second ends of the coil spring, respectively, so that the first and the second elastic extensions of the first plunger hold the second plunger with the first elastic extension
(Continued)

making a forced contact with a surface of the second plunger to form thereat an electric connection between the first and the second plungers.

6 Claims, 12 Drawing Sheets

(51) Int. Cl.
*G01R 1/067* (2006.01)
*G01R 1/04* (2006.01)

(52) U.S. Cl.
CPC ....... *H01R 13/2471* (2013.01); *G01R 1/0466* (2013.01); *H01R 2201/20* (2013.01)

(58) Field of Classification Search
USPC .......................................... 439/700, 786, 824
See application file for complete search history.

(56) References Cited

U.S. PATENT DOCUMENTS

| | | | | |
|---|---|---|---|---|
| 7,154,286 B1 * | 12/2006 | Marx | ................. | H01R 13/2421 324/755.05 |
| 7,381,062 B2 * | 6/2008 | Shimada | ............ | G01R 1/06722 439/66 |
| 7,544,102 B2 * | 6/2009 | Oda | ................... | H01R 13/2421 439/700 |
| 8,231,416 B2 * | 7/2012 | Johnston | ............ | H01R 13/2421 439/700 |
| 8,556,638 B2 * | 10/2013 | Tsubaki | ............. | H01R 12/7076 439/66 |
| 2011/0230105 A1 | 9/2011 | Hsu et al. | | |
| 2011/0248736 A1 * | 10/2011 | Kato | ................... | H01R 13/2421 324/755.05 |
| 2012/0202390 A1 | 8/2012 | Park | | |
| 2013/0065455 A1 * | 3/2013 | Kawata | ................ | G01R 1/0483 439/700 |

FOREIGN PATENT DOCUMENTS

| | | |
|---|---|---|
| JP | 2011-222308 A | 11/2011 |
| TW | M366772 U | 10/2009 |
| WO | 2006-041807 A2 | 4/2006 |
| WO | 2006-135680 A2 | 12/2006 |

OTHER PUBLICATIONS

Written Opinion of the International Searching Authority issued in corresponding application No. PCT/JP2014/069237 mailed Oct. 21, 2014 (3 pages).

Office Action in counterpart Taiwanese Patent Application No. 103123250 issued on May 10, 2016 (9 pages).

\* cited by examiner

PROBE PIN HAVING A FIRST PLUNGER WITH A GUIDE PROJECTION SLIDINGLY MOVABLE IN A GUIDE SLOT OF A SECOND PLUNGER

BACKGROUND

Technical Field

The present invention relates to a probe pin, and for example, relates to a probe pin for use in an integrated circuit test socket.

Related Art

Conventionally, there has been proposed a probe pin disclosed, for example, in Patent Literature 1, in particular in FIG. 6 thereof. The probe pin comprises an upper contact pin, a lower contact pin having the same shape as the upper pin, and a coil spring. The upper and the lower pins are connected to each other within the coil spring with the major surfaces thereof oriented orthogonal to each other and with a pair of hooks of the upper and lower contact pins engaged in the associated slots of the lower and the upper contact pins, respectively.

PATENT LITERATURE

Patent Literature 1: JP 2008-516398 A

SUMMARY

The probe pin is designed so that the pair of hooks of one contact pin engages in the associated slot of the other contact pin to make an electric contact therebetween at at least one contact portion thereof. Unfortunately, the contact between the contact pins is unstable, which results in an unreliable electric connection.

Also, the contact portion of the upper and lower contact pins may not be identified in a precise manner. This requires that dimensional tolerance of the components should be controlled severely, which disadvantageously increases the manufacturing cost of the probe pin.

One or more embodiments of the present invention provides a probe pin with increased contact stability and decreased manufacturing cost.

A probe pin according to one or more embodiments of the invention comprises: a coil spring; a first plunger including a major portion, a first elastic extension and a second elastic extension, the first and the second elastic extensions extending from the major portion in the same direction; and a second plunger forcedly inserted between the first and the second elastic extensions, wherein the first and the second plungers have electric conductivity, and wherein the first and the second plungers are inserted from one and the other ends of the coil spring, respectively, so that the first and the second elastic extensions of the first plunger hold the second plunger with the first elastic extension making a forced contact with a surface of the second plunger to form thereat an electric connection between the first and the second plungers.

According to one or more embodiments of the invention, the first and the second elastic extensions of the first plunger hold the second plunger with the first elastic extension kept in a forced contact with a surface of the second plunger. This results in a stable electric connection between the first and the second plungers without instability of the contact between the contact pins.

In one or more embodiments of the invention, at least the first elastic extension may have a contact part projected therefrom to form the forced contact with the one surface of the second plunger for making the electric connection between the first and the second plungers.

According to one or more embodiments of the invention, the contact part of the first plunger comes into surface contact with the second plunger, which ensures a stable electric contact between the first and the second plungers through the contact part. This requires less dimensional tolerance of the components than ever before and thereby reduces a manufacturing cost of the probe pin.

In one or more embodiments of the invention, the first and the second elastic extensions of the first plunger may have different lengths from each other.

According to one or more embodiments of the invention, a high degree of freedom is provided in designing the probe pins for various applications.

In one or more embodiments of the invention, at least one of the first and the second elastic extensions of the first plunger may include a guide projection, and the second plunger may include a guide slot in which the guide projection is fitted in so that the first and the second plungers slidingly move relative to each other along the guide slot.

According to one or more embodiments of the invention, the first and the second plungers slide smoothly relative to each other by the guide projection and the guide slot. This results in a precise identification of a contact position of the first and the second plungers.

In one or more embodiments of the invention, wherein the first plunger may have first supporting projections provided at proximal portions of the first and the second elastic extensions and first dropout preventing projections provided at positions spaced a distance away from the first supporting projections, and the second plunger may have second supporting projections provided on surfaces thereof opposing in a transverse direction of the second plunger and second dropout preventing projections provided at positions spaced a distance away from the second supporting projections, so that one end of the coil spring is positioned between the first supporting projections and the first dropout preventing projections and the other end of the coil spring is positioned between the second supporting projections and the second dropout preventing projections.

According to one or more embodiments of the invention, one end of the coil spring is positioned between the first supporting projections and the first dropout preventing projections and the other end of the coil spring is positioned between the second supporting projections and the second dropout preventing projections, which prevents rattling movements of the coil spring, dropping of the coil spring, or disassembling of the probe pin.

In one or more embodiments of the invention, an electronic device comprises any one of the probe pin.

According to one or more embodiments of the invention, the electronic device with increased contact stability and decreased manufacturing cost is achieved.

DETAILED DESCRIPTION

With reference to the accompanying drawings, embodiments of the invention will be described below. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention. For convenience of explanation, according to one or more embodiments of the present invention, a coil spring is shown as a transparent member. However, the coil spring is not limited thereto.

First Embodiment

Figure 1A:
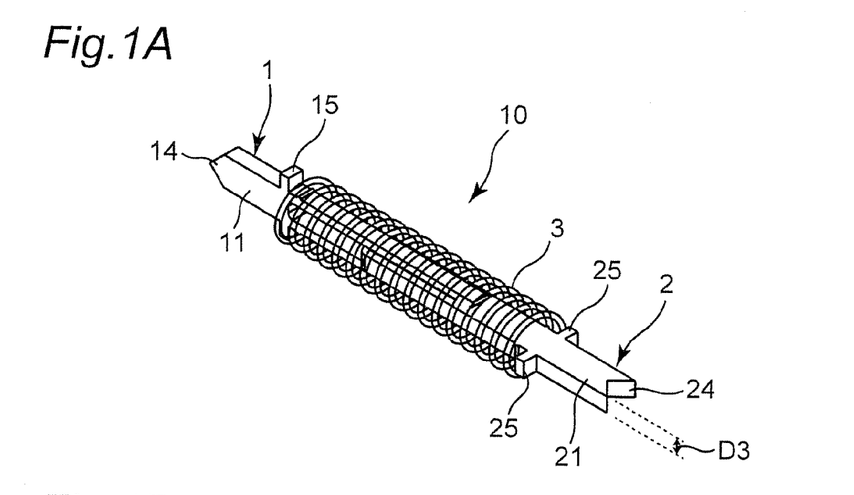
FIG. 1A is a perspective view showing a probe pin according to a first embodiment of the invention.
Figure 1B:
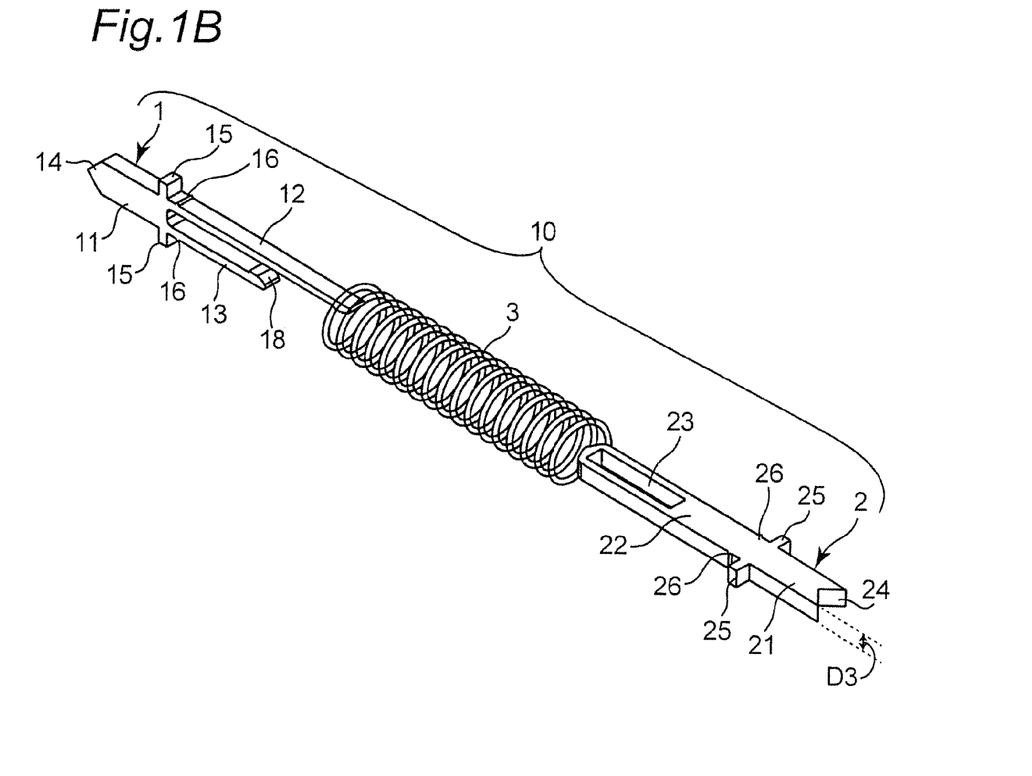
FIG. 1B is an exploded perspective view of the probe pin shown in FIG. 1A.

As shown in FIGS. 1A-1B, a probe pin 10 according to a first embodiment of the invention includes a first plunger 1, a second plunger 2, and a coil spring 3. The first and the second plungers 1 and 2 have electric conductivity and are made by electroforming technique, for example.

Figure 2A:
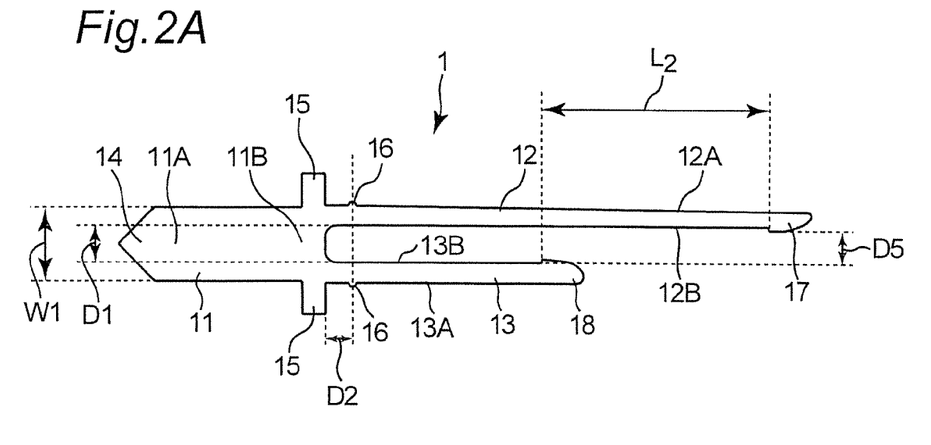
FIG. 2A is a plan view of a first plunger of the probe pin shown in FIGS. 1A and 1B.
Figure 2B:
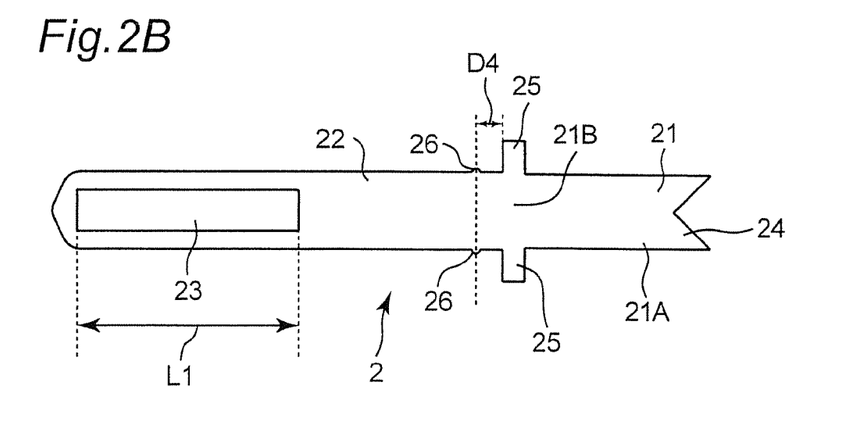
FIG. 2B is a plan view of a second plunger of the probe pin shown in FIGS. 1A and 1B.

As shown in FIGS. 2A-2B, the first plunger 1 includes a major portion 11, a first elastic extension 12, and a second elastic extension 13, having the same thickness.

The major portion 11, which is substantially rectangular in configuration, has one longitudinal end 11A terminated by a tapered distal end 14 and the other longitudinal end 11B with the first and the second elastic extensions 12 and 13 extending therefrom in parallel to each other. The major portion 11 further has a pair of first supporting projections 15 extending orthogonally in the opposite directions from the adjacent proximal ends of the first and the second elastic extensions 12 and 13.

The first and the second elastic extensions 12 and 13 have a rectangular cross section. The first and the second elastic extensions 12 and 13 are designed so that the first and the second elastic extensions 12 and 13 have different lengths from each other. In the first embodiment, the first elastic extension 12 is longer by a length of L2 than the second elastic extension 13.

Specifically, in the first embodiment, as shown in FIGS. 2A-2B, the length L2 is defined by a difference between a length of the first elastic extension 12 from the longitudinal proximal end 11B of the major portion 11 to the contact part 17 thereof (described below) and a length of the second elastic extension 13 from the longitudinal proximal end 11B to a guide projection 18 thereof (described below).

The first and the second elastic extensions 12 and 13 are spaced a certain gap D1, defined therebetween, away from each other in the transverse direction of the major portion 11. Also, the first and the second elastic extensions 12 and 13 are configured so that a distance between the opposite, longitudinal outwardly facing surfaces 12A and 13A of the first and the second elastic extensions 12 and 13 is substantially the same as a transverse length or width W1 of the major portion 11.

The outwardly facing surfaces 12A and 13A of the first and the second elastic extensions 12 and 13 have a dropout preventing protrusion 16 formed therewith. The dropout preventing protrusion 16 is positioned with its center located at a position spaced a certain distance D2 away from the associated supporting projection 15. The contact part 17 is provided at the distal end of the inwardly facing surface 12B of the first elastic extension 12, and the guide projection 18 is provided at the distal end of the inwardly facing surface 13B of the second elastic extension 13.

The contact part 17 of the first elastic extension 12 may take appropriate shapes and sizes according to the design requirements of the probe pin. For example, a change in shape of the contact part 17 allows controlling a contact force of the first elastic extension 12 against the second plunger 2.

The guide projection 18 of the second elastic extension 13 has appropriate shapes and sizes which allows the guide projection 18 to engage in and move along a guide slot 23 (described below), allowing a relative sliding and reciprocating movement between the first and the second plungers 1 and 2.

As shown in FIGS. 1A-1B and 2A-2B, the second plunger 2 has a major portion 21 and a contact portion 22, having the same thickness D3. The contact portion 22 has the guide slot 23.

The major portion 21, which has a substantially rectangular configuration as shown in FIG. 2B, has one longitudinal end 21A terminated by a distal end 24 formed with a V-shaped notch and the other longitudinal end 21B terminated by a substantially rectangular contact portion 22. The contact portion 22 has a substantially tapered distal end indicated on the left side in FIG. 2B and the guide slot 23 adjacent the distal end defined therein. The other longitudinal end 21B of the major portion 21 has a pair of substantially rectangular supporting projections 25 extending orthogonally in the opposite directions from the adjacent proximal end side surfaces thereof. The outwardly facing surfaces of the contact portion 22 each have a dropout preventing projection 26 formed therewith. The dropout preventing projection 26 is positioned with its center positioned at a position spaced a certain distance D4 away from the associated supporting projection 25 in a direction toward the distal end of the contact portion 22.

An appropriated surface finishing such as plating or coating may be provided to the first and the second plungers 1 and 2 according to the design requirements.

Figure 3A:
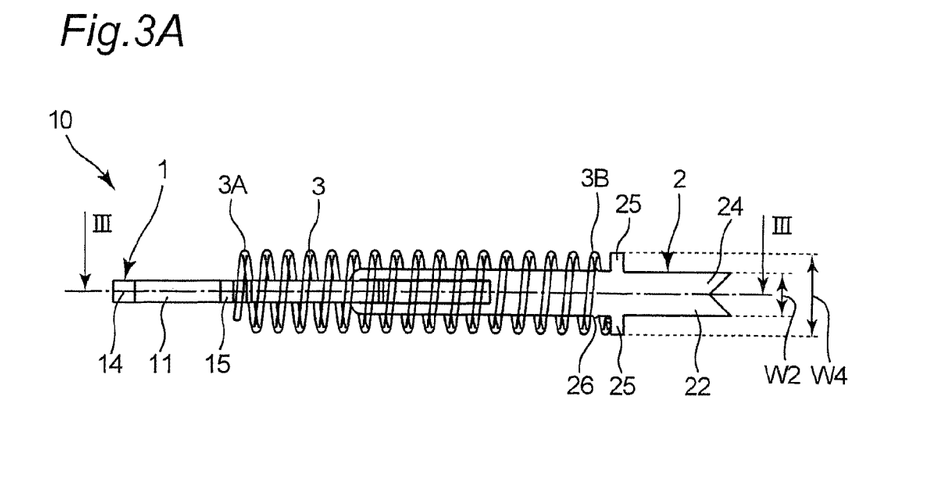
FIG. 3A is a front elevational view of the probe pin shown in FIGS. 1A and 1B.
Figure 3B:
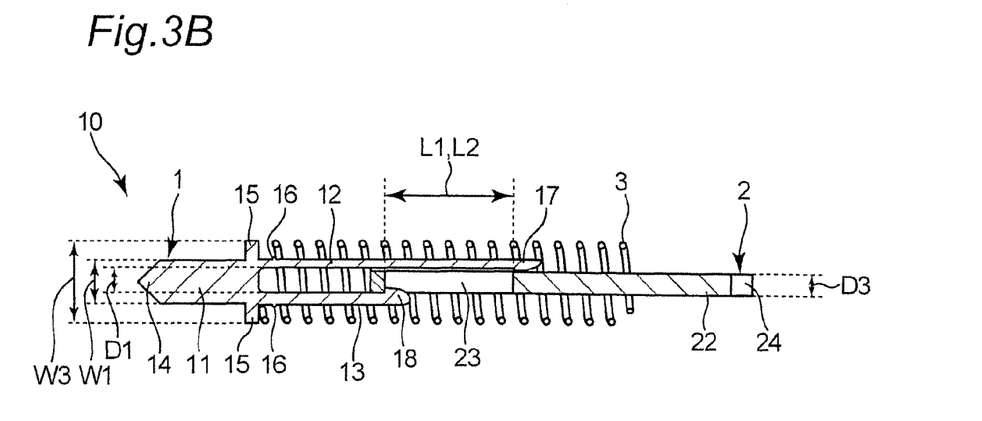
FIG. 3B is a cross sectional view of the probe pin shown in FIGS. 1A and 1B taken along lines III-III in FIG. 3A.
Figure 4A:
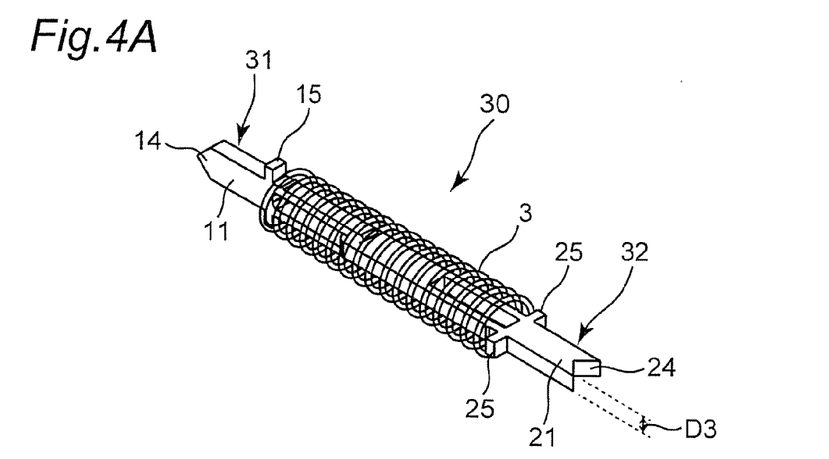
FIG. 4A is a perspective view of a probe pin of a second embodiment of the invention.
Figure 4B:
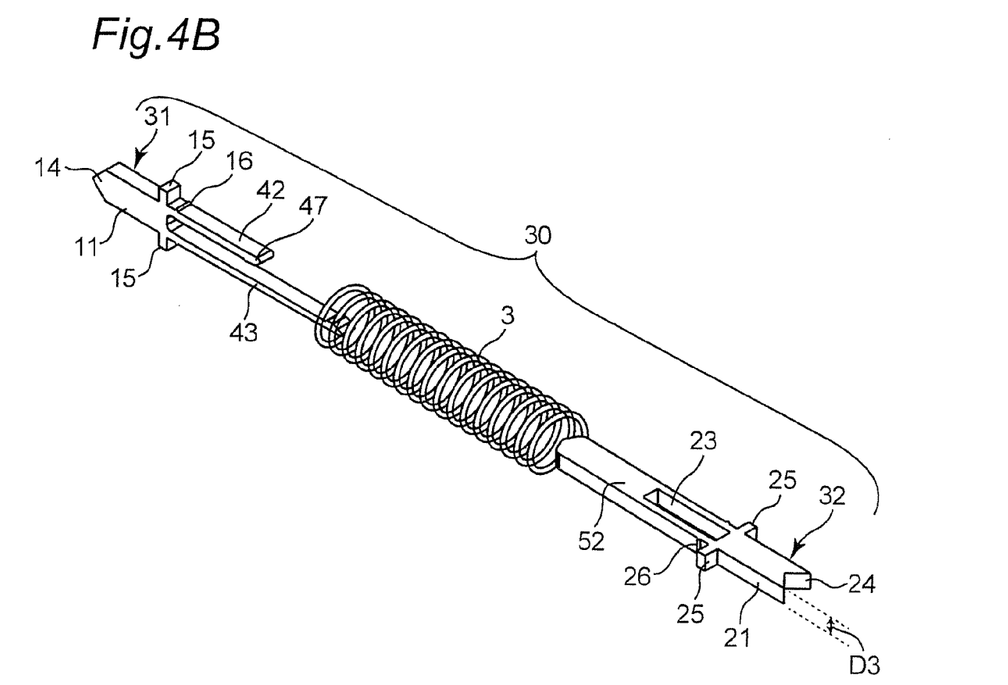
FIG. 4B is an exploded view of the probe pin shown in FIG. 4A.

As shown in FIGS. 3A-3B, the coil spring 3, which is made of, for example, carbon steel or stainless steel, has an inside diameter slightly larger than the width W1 of the first plunger 1 and a width W2 of the second plunger 2. The coil spring 3 further has an outside diameter which is substantially equal to a total width W3 of the major portion 11 and the supporting projections 15 of the first plunger 1 and also a total width W4 of the major portion 21 and the supporting projections 25 of the second plunger 2. A length of the coil spring 3 is determined so that, when mounted on the assembled first and second plungers 1 and 2, the spring 3 is compressed between and by the plungers to generate a predetermined repelling force against the plungers.

The first and the second plungers 1 and 2 are designed so that the width W1 of the first plunger 1 and the width W2 of the second plunger are the same.

The supporting projections 15 and 25 have the same shape and size. This means that the total width W3 of the major portion 11 and the supporting projections 15 of the first plunger 1 is the same as the total width W4 of the major portion 21 and the supporting projections 25 of the second plunger 2.

The first and the second plungers 1 and 2 are assembled so that one of those plungers can slide and move relative to the other.

In assembling, the first and the second plungers 1 and 2 are aligned so that the first and the second elastic extensions 12 and 13 oppose the distal end of the contact portion 22 of the second plunger 2. Then, the opposing ends of the first and the second plungers 1 and 2 are inserted through the opposite end openings of the coil spring 3 into the interior of the coil spring 3 as the distal end of the second plunger 2 is forced between the first and the second elastic extensions 12 and 13 and thereby retained between the first and the second elastic extensions 12 and 13.

In this operation, as shown in FIGS. 3A-3B, the first plunger 1 is inserted in a first end 3A of the coil spring 3, and the guide projection 18 of the second elastic extension 13 of the first plunger 1 is fitted in the guide slot 23 of the second plunger 2, which allows the relative sliding movement of the first and the second plungers 1 and 2 along the guide slot 23. The guide projection 18 regulates the sliding movement between the first and the second plungers 1 and 2 within the range of the guide slot 23. This means that the maximum amount of movement of the first plunger 1 relative to the second plunger 2 or vice versa amounts to the length of the guide slot 23.

The second plunger 2 is inserted in a second end 3B of the coil spring 3. As shown in FIGS. 2A-2B, the first and the second plungers 1 and 2 are designed so that a difference L2 between the lengths of the first and the second elastic extensions 12 and 13 is substantially the same as the length L1 of the guide slot 23. This ensures that the contact part 17 of the first elastic extension 12 of the first plunger 1 stays in contact with the contact portion 22 of the second plunger 2 irrespective of the movement of the first plunger 1 relative to the second plunger 2 or vice versa.

The first and the second elastic extensions 12 and 13 of the first plunger 1 are designed so that a distance D5 between the contact part 17 of the first elastic extension 12 and the inwardly facing surface 13B of the second elastic extension 13 is smaller than the thickness D3 of the second plunger 2. This causes that, when the first and the second plungers 1 and 2 are assembled to each other, the contact part 17 of the first elastic extension 12 stays in contact with the contact portion 22 of the second plunger 2 as it is forced outward (upward in FIGS. 2A-2B) by the contact portion 22, which ensures that the first elastic extension 12 always keeps in forced contact with the associated surface of the contact portion 22 of the second plunger 2. This results in a stable electric connection between the first and the second plungers 1 and 2 through the forcedly contacting portion, or contact portion 22.

As described above, the contact part 17 of the first elastic extension 12 of the first plunger 1 always stays on and keeps in forced contact with one surface of the contact portion 22 of the second plunger 2, which ensures a stable contact between the first and the second plungers 1 and 2. Also, the first and the second plungers 1 and 2 maintain a contact at the contact part 17 during the relative sliding movement of the first and the second plungers 1 and 2 along the guide slot 23, which ensures a stable electric contact between the first and the second plungers 1 and 2 through the contact portion 22. This requires less dimensional tolerance of the components than ever before and thereby reduces a manufacturing cost of the probe pin.

When assembled, the first end 3A of the coil spring 3 stays between the supporting projections 15 and the dropout preventing protrusions 16 of the first plunger 1 and the second end 3B of the coil spring 3 stays between the supporting projections 25 and the dropout preventing protrusions 26 of the second plunger 2. This results in that one end of the coil spring 3 is held by the supporting projection 15 and the dropout preventing protrusion 16 of the first plunger 1 and the other end of the coil spring 3 is held between the supporting projection 25 and the dropout preventing protrusion 26 of the second plunger 2, which prevents rattling movements of the coil spring 3, dropping of the coil spring 3, or disassembling of the probe pin 10.

The dropout preventing protrusions 16 and 26 of the first and the second plungers 1 and 2 take appropriate shapes and sizes provided that they hold the coil spring 3 therebetween when assembled.

The distance D2 between the supporting projection 15 and the dropout preventing protrusion 16 of the first plunger 1 is determined so that the first end 3A of the coil spring 3 is held therebetween. The distance D4 between the supporting projection 25 and the dropout preventing protrusion 26 of the second plunger 2 is determined so that the second end 3B of the coil spring 3 is held therebetween.

Although the difference in length L2 between the first and the second elastic extensions 12 and 13 is substantially the same as the length L1 of the guide slot 23 in the first embodiment, this is not restrictive and they may take any dimensions as long as the length L2 is equal to or greater than the length L1 of the guide slot 23.

Although the major portion 11 and the first and the second elastic extensions 12 and 13 of the first plunger 1 have the same thickness and the major portion 21 and the contact portion 22 of the second plunger 2 have the same thickness in the first embodiment, this is not restrictive and they may have different thicknesses.

Second Embodiment

As shown in FIGS. 4A to 6B, a probe pin 30 according to a second embodiment of the invention has a first plunger 31, a second plunger 32, and a coil spring 3. The first and the second plungers 31 and 32 have electric conductivity and are formed by electroforming technique, for example. Like parts are designated like reference numerals as used in the first embodiment.

Figure 5A:
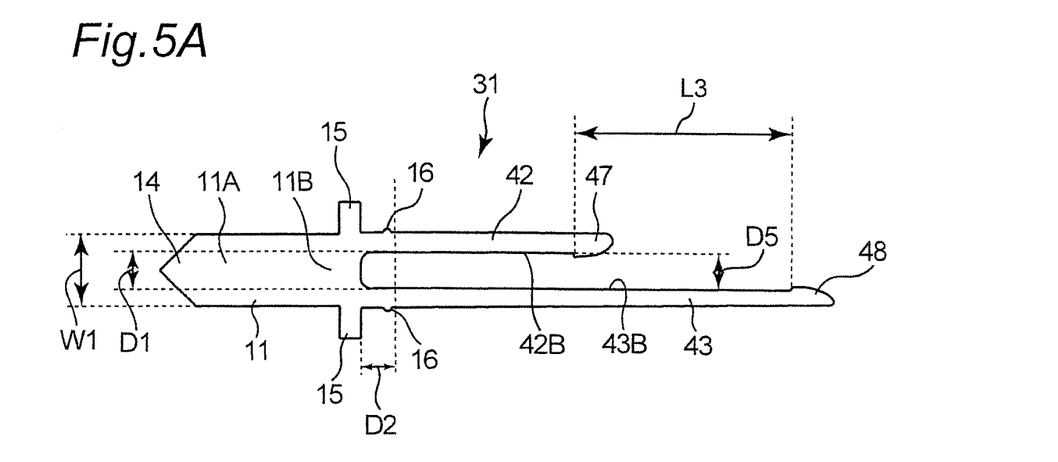
FIG. 5A is a plan view of a first plunger of the probe pin shown in FIGS. 4A and 4B.
Figure 5B:
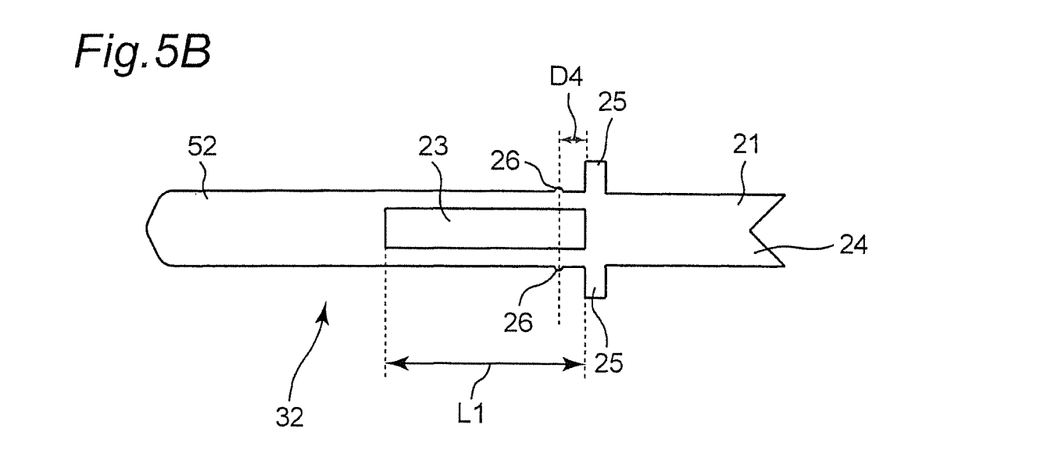
FIG. 5B is a plan view of a second plunger of the probe pin shown in FIGS. 4A and 4B.

As shown in FIGS. 5A-5B, the first plunger 31 has a first elastic extension 42 and a second elastic extension 43. The first and the second elastic extensions 42 and 43 extend in parallel to each other from the longitudinal proximal end 11B of the major portion 11, and are designed so that the second elastic extension 43 is longer by a length L3 than the first elastic extension 42. The second plunger 32 has a major portion 21 and a contact portion 52. The contact portion 52 has a guide slot 23 formed at a portion adjacent the major portion 21. The guide slot 23 is defined by a part of a side in the longitudinal direction of the major portion 21 and the contact portion 52.

In the second embodiment, as shown in FIGS. 5A-5B, the length L3 is defined by a difference between a length of the first elastic extension 42 from the longitudinal proximal end 11B of the major portion 11 to a contact part 47 thereof and a length of the second elastic extension 43 from the longitudinal proximal end 11B to a guide projection 48 thereof.

Figure 6A:
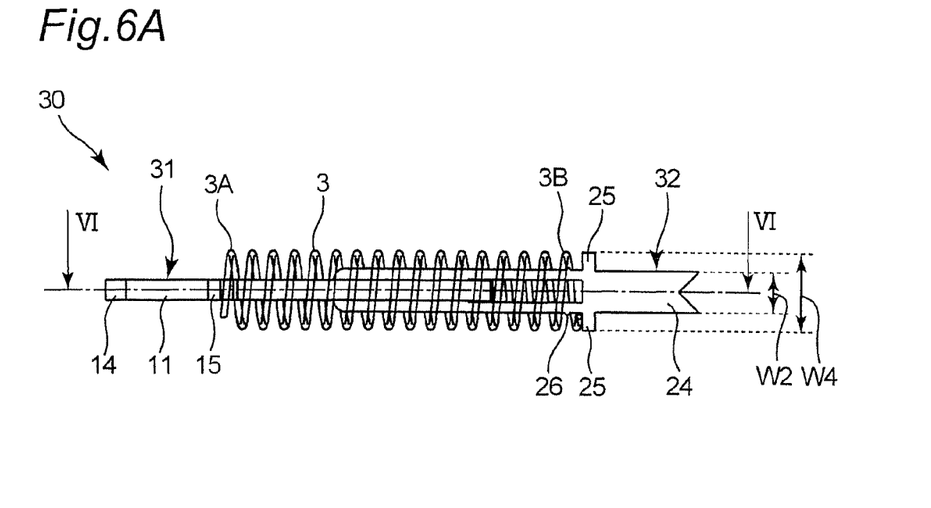
FIG. 6A is a front elevational view of the probe pin shown in FIGS. 4A and 4B.
Figure 6B:
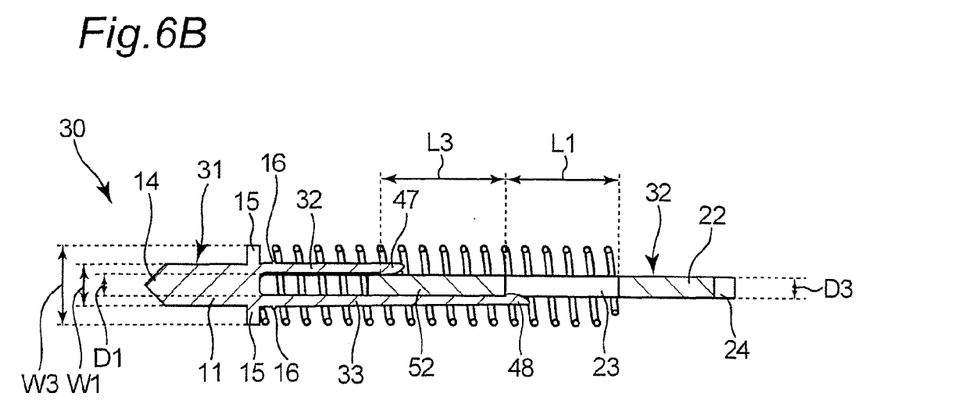
FIG. 6B is a cross sectional view of the probe pin shown in FIGS. 4A and 4B taken along lines VI-VI in FIG. 6A.
Figure 7A:
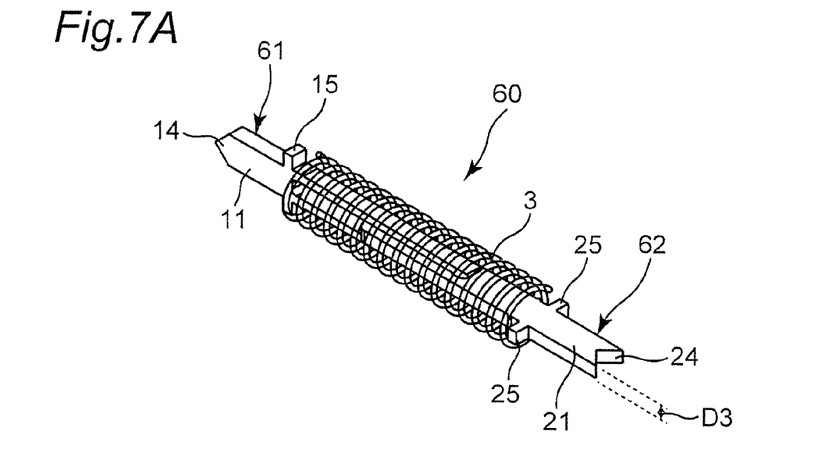
FIG. 7A is a perspective view of a probe pin of a third embodiment of the invention.
Figure 7B:
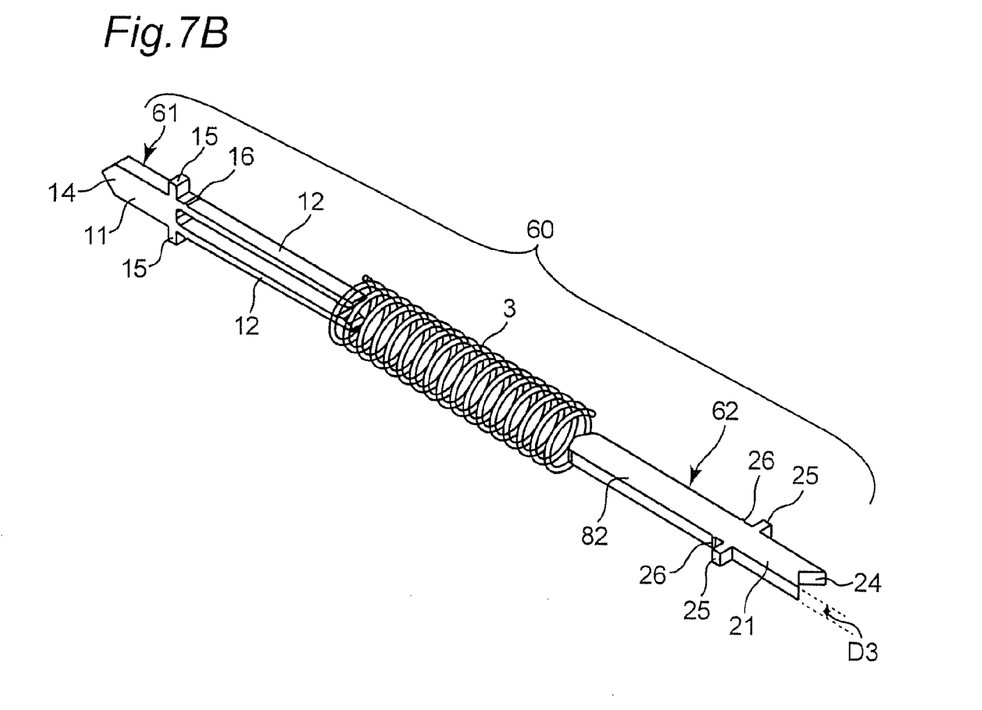
FIG. 7B is an exploded view of the probe pin shown in FIG. 7A.

As shown in FIGS. 6A-6B, when assembled, the guide projection 48 of the second elastic extension 43 of the first plunger 31 is fitted in the guide slot 23 of the contact portion 52 of the second plunger 32 to regulate the sliding movement between the first and the second plungers 31 and 32 within the range of the guide slot 23. The first and the second elastic extensions 42 and 43 are configured so that a difference in length L3 is substantially the same as the length L1 of the guide slot 23. This results in that the contact part 47 of the first elastic extension 42 of the first plunger 31 always stays on and keeps in forced contact with one surface of the contact portion 52 of the second plunger 32, which ensures a stable contact between the first and the second plungers 31 and 32.

The contact part 47 of the first elastic extension 42 and the guide projection 48 of the second elastic extension 43 may take appropriate sizes and shapes according to the design requirements of the probe pin.

Although the difference in length L3 between the first and the second elastic extensions 42 and 43 is substantially the same as the length L1 of the guide slot 23 in the second embodiment, this is not restrictive and they may take any dimensions as long as the length L3 is equal to or greater than the length L1 of the guide slot 23.

Third Embodiment

As shown in FIGS. 7A to 9B, a probe pin 60 according to a third embodiment of the invention has a first plunger 61, a second plunger 62, and a coil spring 3. The first and the second plungers 61 and 62 have electric conductivity and are made by electroforming technique, for example. Like parts are designated like reference numerals as used in the first embodiment.

Figure 8A:
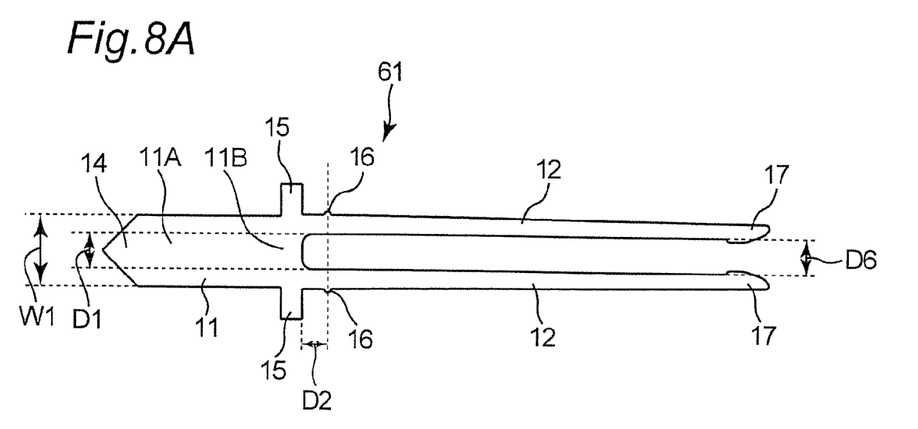
FIG. 8A is a plan view of a first plunger of the probe pin shown in FIGS. 7A and 7B.
Figure 8B:
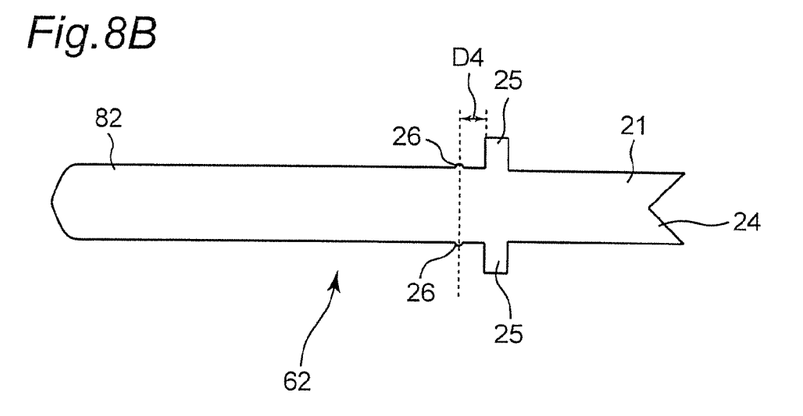
FIG. 8B is a plan view of a second plunger of the probe pin shown in FIGS. 7A and 7B.

As shown in FIGS. 8A-8B, the first plunger 61 of the probe pin 60 has first elastic extensions 12 which are arranged symmetrically with respect to a longitudinal central axis of a major portion 11. The second plunger 62 has a major portion 21 and a contact portion 82. No guide slot is provided in the contact portion 82.

Figure 9A:
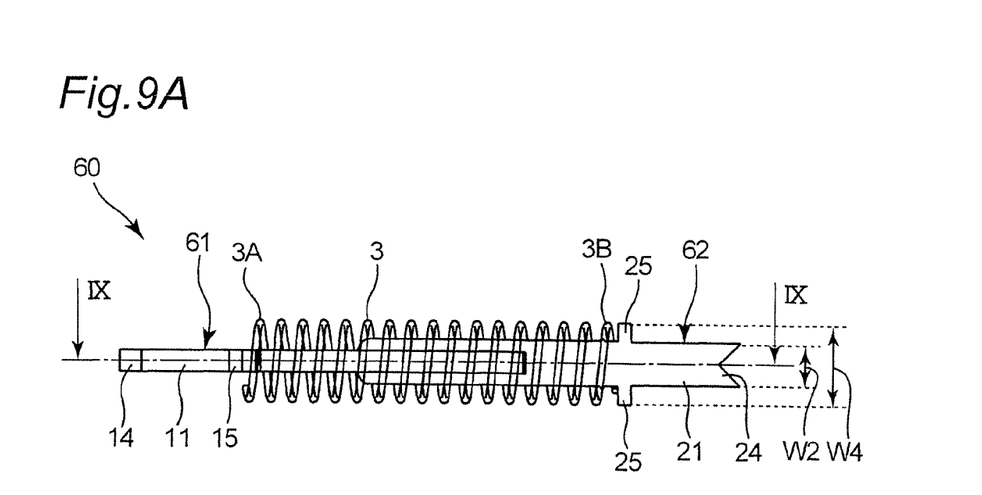
FIG. 9A is a front elevational view of the probe pin shown in FIGS. 7A and 7B.
Figure 9B:
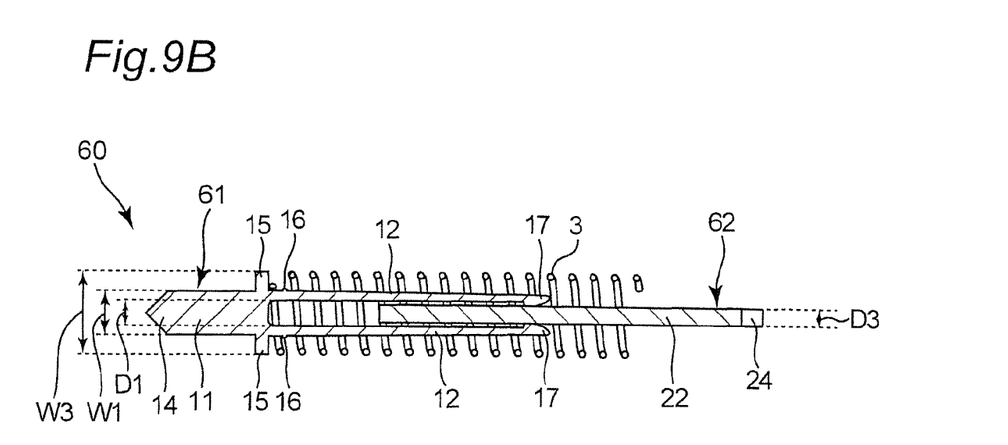
FIG. 9B is a cross sectional view of the probe pin shown in FIGS. 7A and 7B taken along lines IX-IX in FIG. 9A.
Figure 10A:
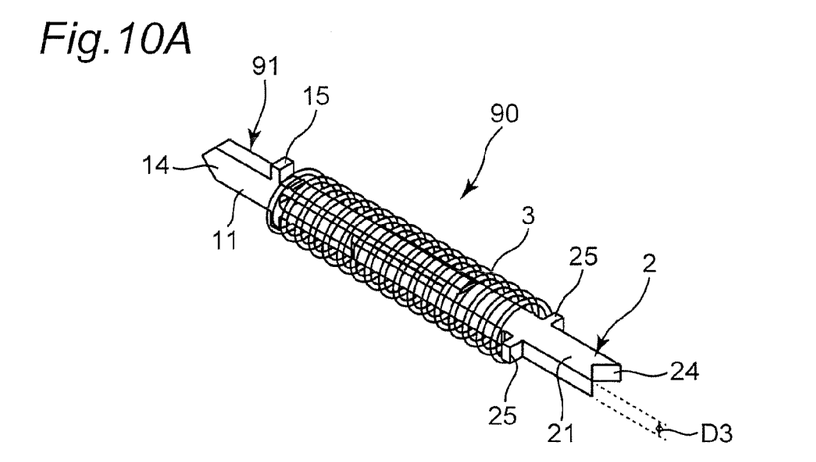
FIG. 10A is a perspective view of a probe pin of a fourth embodiment of the invention.
Figure 10B:
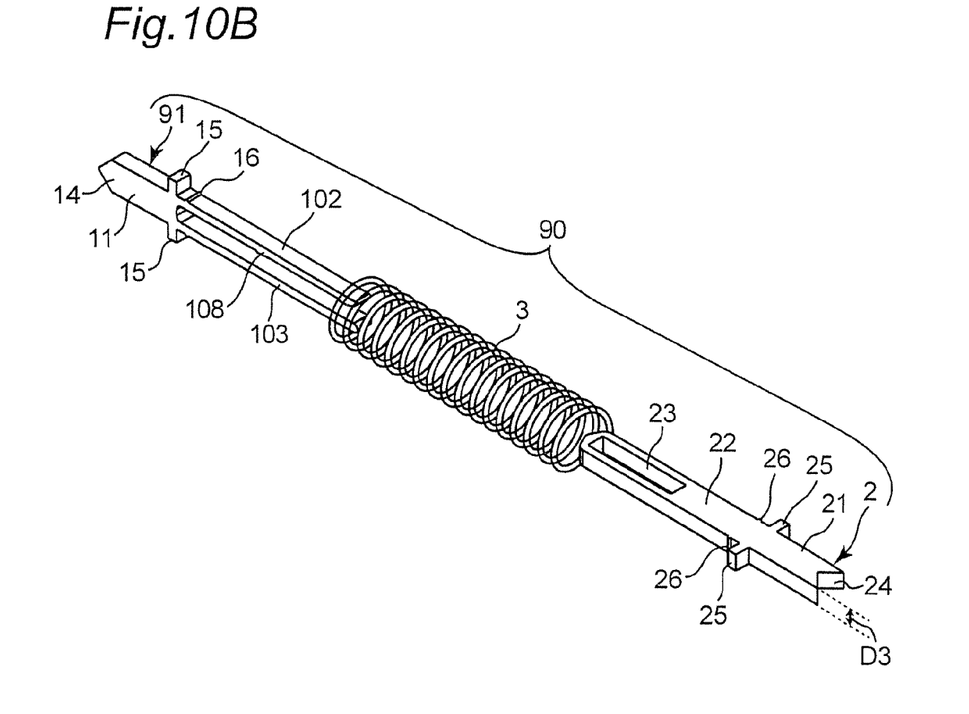
FIG. 10B is an exploded view of the probe pin shown in FIG. 10A.

As shown in FIGS. 9A-9B, when assembled, the first elastic extensions 12 of the first plunger 61 hold the second plunger 2. The first elastic extensions 12 are configured so that a distance D6 between the contact parts 17 is smaller than a thickness D3 of the second plunger 62. This allows that, when assembled, the contact parts 17 of the first elastic extensions 12 are always forced outward by the contact portion 82 of the second plunger 62, which ensures that the first elastic extensions 12 always keeps in forced contact with the associated surface of the contact portion 82 of the second plunger 62. This results in a stable contact and then a reliable electric connection between the first and the second plungers 61 and 62.

Fourth Embodiment

As shown in FIGS. 10A to 12B, a probe pin 90 according to a fourth embodiment of the invention has a first plunger 91, a second plunger 2, and a coil spring 3. The first plunger 91 has electric conductivity and is made by electroforming technique, for example. Like parts are designated like reference numerals as used in the first embodiment.

Figure 11A:
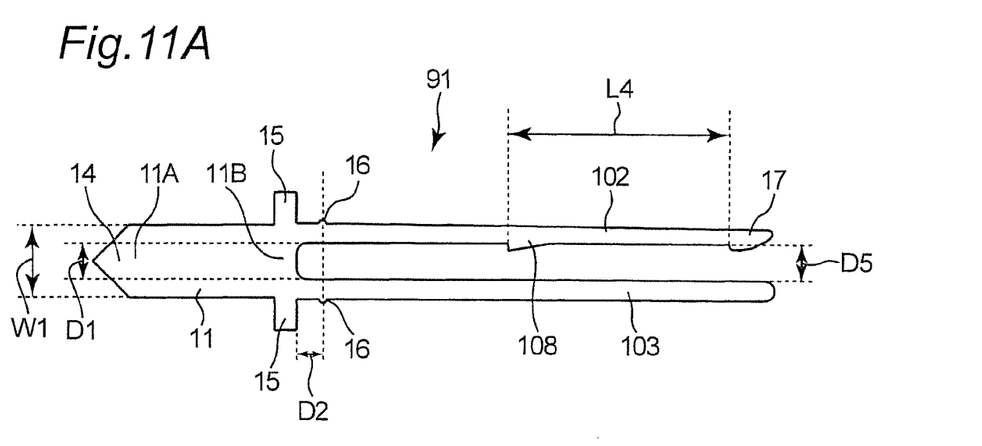
FIG. 11A is a plan view of a first plunger of the probe pin shown in FIGS. 10A and 10B.
Figure 11B:
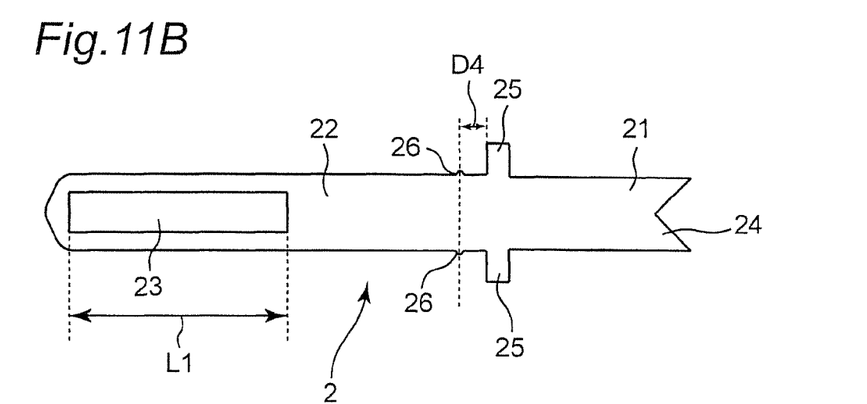
FIG. 11B is a plan view of a second plunger of the probe pin shown in FIGS. 10A and 10B.

As shown in FIGS. 11A-11B, the first plunger 91 of the probe pin 90 has a first elastic extension 102 and a second elastic extension 103.

As shown in FIGS. 11A-11B, the first elastic extension 102 is provided by adding a guide projection 108 at substantially a mid-portion of the inwardly facing surface 12B of the first elastic extension 12 of the first embodiment. The guide projection 108 is provided at a position spaced a distance L4 away from the distal contact part 17. The second elastic extension 103 is in the form of square rod and has the same length as the first elastic extension 102. The first and the second elastic extensions 102 and 103, which are spaced a certain distance D1 away from each other in the transverse direction of the major portion 11, extend in parallel to each other from the longitudinal proximal end 11B of the major portion 11.

Specifically, in the fourth embodiment, as shown in FIGS. 11A-11B, the length L4 is defined by a difference between a length of the first elastic extension 102 from the longitudinal proximal end 11B of the major portion 11 to a contact part 17 thereof and a length of the first elastic extension 102 from the longitudinal proximal end 11B to a guide projection 108 thereof.

Figure 12A:
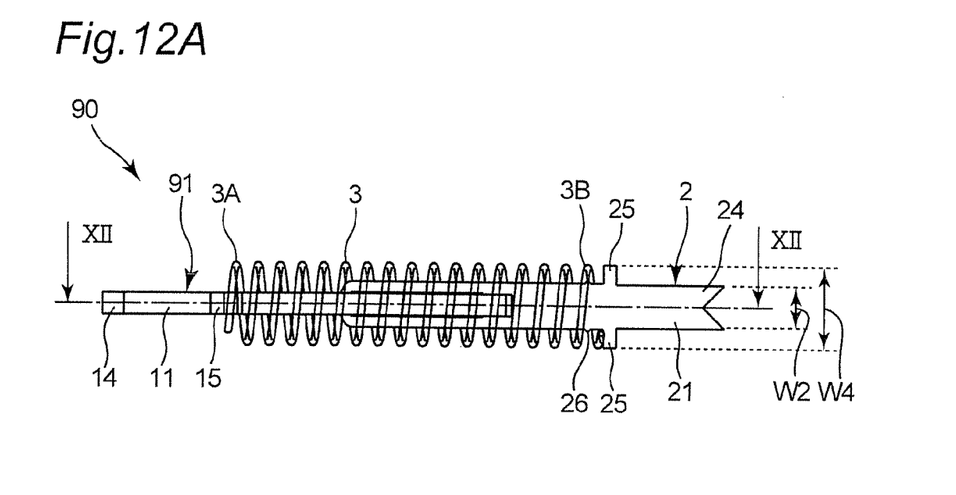
FIG. 12A is a front elevational view of the probe pin shown in FIGS. 10A and 10B.
Figure 12B:
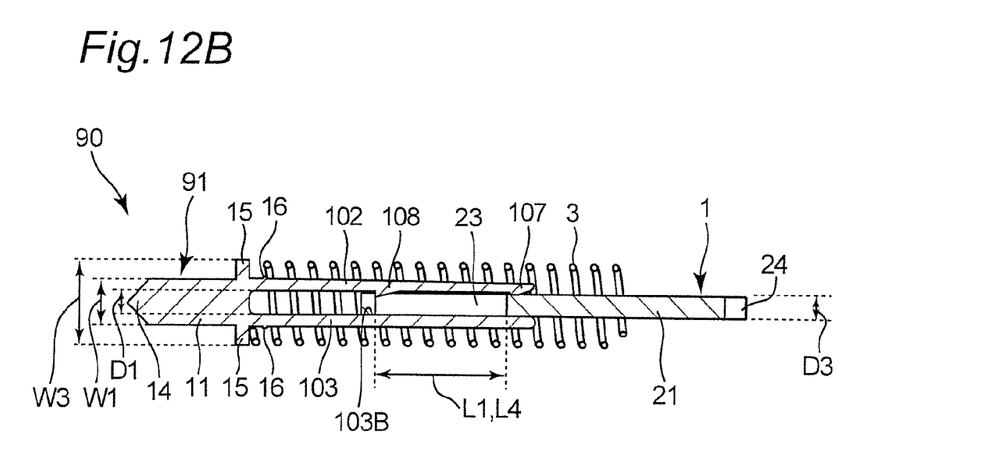
FIG. 12B is a cross sectional view of the probe pin shown in FIGS. 10A and 10B taken along lines XII-XII in FIG. 12A.

As shown in FIGS. 12A-12B, when assembled, the guide projection 108 of the first elastic extension 102 of the first plunger 91 is fitted in the guide slot 23 of the contact portion 22 of the second plunger 2 to regulate the sliding movement between the first and the second plungers 91 and 2 within the range of the guide slot 23. The length L4 between the contact part 17 and the guide projection 108 is substantially the same as the length L1 of the guide slot 23, which allows that the contact part 17 of the first elastic extension 102 of the first plunger 91 always stays on one surface of the contact portion 22 of the second plunger 2.

When assembled, the second plunger 2 is held between the first and the second elastic extensions 102 and 103 of the first plunger 91. The distance D5 between the contact part 17 of the first elastic extension 102 and the inwardly facing surface 103B of the second elastic extension 103 is smaller than the thickness D3 of the second plunger 2. This allows that, when assembled, the contact part 17 of the first elastic extension 102 stays in contact with the contact portion 22 of the second plunger 2 as it is forced outward by the contact portion 22, which ensures that the first elastic extension 102 always keeps in forced contact with the associated surface of the contact portion 22 of the second plunger 2. Also, the inwardly facing surface 103B of the second elastic extension 103 always comes into surface contact with the second plunger 2. This results in a secure contact and a stable electric connection between the first and the second plungers 91 and 2.

Although the length L4 between the contact part 17 and the guide projection 108 of the first elastic extension 102 is substantially the same as the length L1 of the guide slot 23 in the fourth embodiment, this is not restrictive and they may take any dimensions as long as the length L4 is equal to or greater than the length L1 of the guide slot 23.

Although the first plungers 1, 31, 61 and 91 and the second plungers 2, 32 and 62 are made by electroforming technique in the first to fourth embodiments, this is not restrictive and they may be made by different manners capable of manufacturing the first plungers 1, 31, 61, and 91 and the second plungers 2, 32 and 62.

Although the first plungers 1, 31, 61, and 91 have the first elastic extensions 12, 42 and 102 and the second elastic extensions 13, 43 and 103 extending therefrom in parallel to each other and in the same direction in the first to fourth embodiments, this is not restrictive. For example, the first plunger may have first and second elastic extensions which extend so that a distance therebetween becomes gradually narrower toward the distal end thereof, which allows a contact pressure of the first and the second elastic extensions relative to the second plunger to be increased.

Each of the structural components of the probe pins 10, 30, 60 and 90 in the first to fourth embodiments may be replaced with another similar component in a different embodiment or may be added to a different embodiment.

Each of the probe pins 10, 30, 60 and 90 in the first to fourth embodiments may be incorporated in an electronic device such as an integrated circuit test socket.

The invention is not limited to first to fourth embodiments described above.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

| Parts List |
| --- |
| 1, 31, 61, 91: first plunger |
| 2, 32, 62: second plunger |
| 3: coil spring |
| 10, 30, 60, 90: probe pin |
| 11, 21: major portion |
| 12, 42, 102: first elastic extension |
| 13, 43, 103: second elastic extension |
| 14, 24: tip part |
| 15, 25: supporting projection |
| 16, 26: dropout preventing protrusion |
| 17, 47, 107: contact part |
| 18, 48, 108: guide projection |
| 22, 52, 82: contact portion |
| 23: guide slot |

The invention claimed is:

1. A probe pin, comprising:
   a coil spring;
   a first plunger made from an electrically conductive material; and
   a second plunger made from an electrically conductive material,
   wherein the first plunger comprises:
      a first major portion,
      a first elastic extension, and
      a second elastic extension,
   wherein the first elastic extension and the second elastic extension extend from the first major portion in parallel in a longitudinal direction of the first plunger,
   wherein the first elastic extension and the second elastic extension have different lengths in the longitudinal direction,
   wherein the first elastic extension and the second elastic extension have respective first and second inner surfaces opposing each other,
   wherein the first inner surface of the first elastic extension has a first contact portion,
   wherein the second inner surface of the second elastic extension has a guide projection projecting toward the first elastic extension,
   wherein the first contact portion and the guide projection are spaced away from each other in the longitudinal direction,
   wherein the second plunger comprises:
      a second major portion,
      a second contact portion disposed adjacent to the second major portion, and
      a guide slot disposed in a direction away from the second major portion with respect to the second contact portion,
   wherein the first plunger is inserted in an inside of the coil spring from a first end of the coil spring, and the second plunger is inserted in the inside of the coil spring from a second end of the coil spring, and
   wherein the first plunger and the second plunger are combined with each other with the guide projection engaged in the guide slot and with the first contact portion forced in contact with the second contact portion, such that the first plunger is slidingly movable relative to the second plunger in the longitudinal direction while maintaining an electrical contact between the first and second contact portions of the first and second plungers.

2. The probe pin of claim 1,
   wherein the first plunger comprises a first projection disposed at adjacent proximal ends of the first and second elastic extensions, and a first protrusion disposed distally away from the first projection,
   wherein the second plunger comprises a second projection disposed at adjacent a proximal end of the second major portion, and a second protrusion disposed distally away from the second projection,
   wherein the first end of the coil spring is engaged on a portion of the first plunger between the first projection and the first protrusion, and
   wherein the second end of the coil spring is engaged on a portion of the second plunger between the second projection and the second protrusion.

3. The probe pin of claim 1, wherein a difference between the longitudinal lengths of the first elastic extension and the second elastic extension is greater than or equal to a longitudinal length of the guide slot.

4. An electronic device comprising the probe pin of claim 1.

5. A plunger for use as the first plunger of the probe pin of claim 1.

6. A plunger for use as the second plunger of the probe pin of claim 1.

* * * * *